United States Patent [19]
Goto

[11] Patent Number: 6,137,289
[45] Date of Patent: Oct. 24, 2000

[54] MR IMAGING METHOD AND APPARATUS

[75] Inventor: Takao Goto, Tokyo, Japan

[73] Assignee: GE Yokogawa Medical Systems, Limited, Tokyo, Japan

[21] Appl. No.: 09/286,256

[22] Filed: Apr. 5, 1999

[30] Foreign Application Priority Data

May 21, 1998 [JP] Japan .................................. 10-140295

[51] Int. Cl.$^7$ ...................................................... G01V 3/00
[52] U.S. Cl. ........................... 324/306; 324/309; 600/410
[58] Field of Search ................................... 324/306, 309, 324/307; 600/410

[56] References Cited

U.S. PATENT DOCUMENTS

| | | | |
|---|---|---|---|
| 4,683,431 | 7/1987 | Pattany | 324/306 |
| 5,007,426 | 4/1991 | Le Roux | 324/306 |
| 5,592,084 | 1/1997 | Sepponen | 324/306 |
| 5,652,513 | 7/1997 | Liu et al. | 324/306 |

OTHER PUBLICATIONS

Shading artifacts in phase contrast angiography induced by maxwell terms; analysis and correction Matt A. Bernstein, et al, source not known, copy attached.

*Primary Examiner*—Christine K. Oda
*Assistant Examiner*—Brij B. Shrivastav
*Attorney, Agent, or Firm*—Moonray Kojima

[57] ABSTRACT

In order to prevent image quality degradation which occurs when a flow compensating pulse is applied in a pulse sequence according to the fast spin echo technique, a bipolar pulse constituted of gzfcf and gzmfcf (FIG. 5) is incorporated in the slice gradient before an inversion pulse applied immediately before the flow compensating pulse constituted of fcrdep and fcrrep incorporated in the read gradient in the pulse sequence, thereby imparting a phase shift equal to a non-linear phase shift due to the flow compensating pulse constituted of fcrdep and fcrrep.

2 Claims, 5 Drawing Sheets

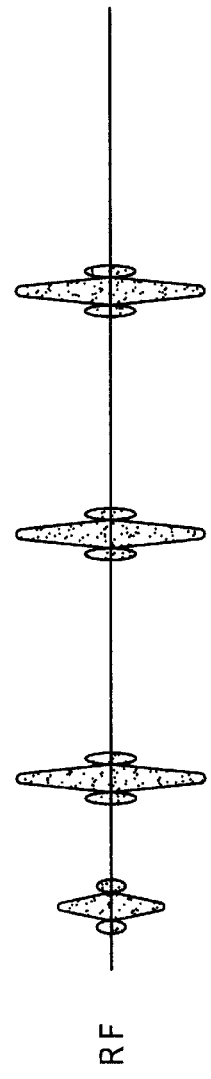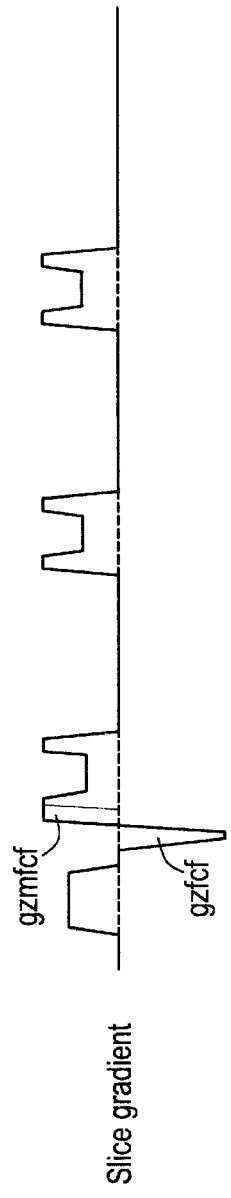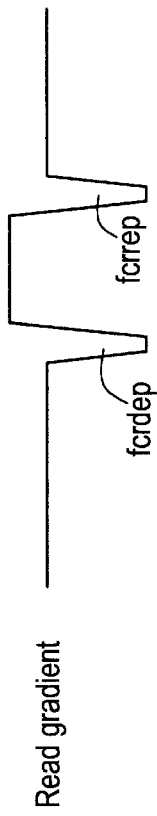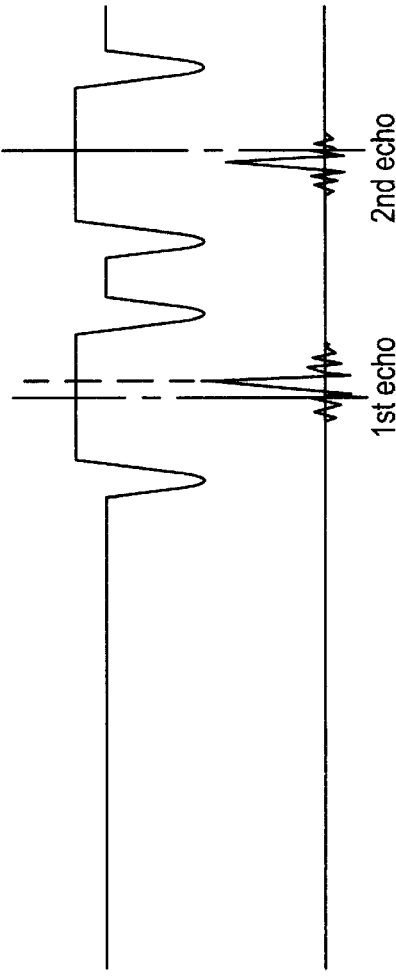
FIG. 6A  RF
FIG. 6B  Slice gradient
FIG. 6C  Read gradient
FIG. 6D  Encoding gradient
FIG. 6E  Observed gradient

MR IMAGING METHOD AND APPARATUS

BACKGROUND OF THE INVENTION

The present invention relates to an MR (magnetic resonance) imaging method and apparatus which prevents image quality degradation which occurs when a flow compensating pulse is applied.

The conventional fast spin echo technique includes a pulse sequence incorporating a flow compensating pulse constituted of fcrdep and fcrrep in the read gradient (FIG. 5). By incorporating the flow compensating pulse constituted of fcrdep and fcrrep in the read gradient, image quality degradation due to flowing spins can be avoided (flow compensation).

The incorporation of the flow compensating pulse constituted of fcrdep and fcrrep may cause ghosts. In systems utilizing a high magnetic field of the order of 1.5 T or a medium magnetic field of the order of 0.5 T, the ghosts negligibly degrade image quality and do not cause a significant problem.

However, in systems utilizing a low magnetic field of the order of 0.2 T, the ghosts are troublesome because they significantly degrade image quality.

SUMMARY OF THE INVENTION

It is an object of the present invention to provide an MR imaging method and apparatus which prevents image quality degradation which occurs when a flow compensating pulse is applied.

In accordance with a first aspect, the present invention provides an MR imaging method wherein: a flow compensating pulse is incorporated in a read gradient of a pulse sequence according to the fast spin echo technique; and a bipolar pulse is incorporated in a slice gradient before an inversion pulse applied immediately before the flow compensating pulse, to impart a phase shift equal to a non-linear phase shift due to the flow compensating pulse.

The reason why the ghosts are generated by incorporating the flow compensating pulse is that a non-linear spatial phase change arises in the encode axis.

Specifically, when a main magnetic field is represented as $B_0$ and linear gradient magnetic fields in the X, Y and Z directions are represented as $G_x$, $G_y$ and $G_z$, respectively, the magnetic field $B_z$ (x, y, z, t) at a point (x, y, z) and at a time (t) is theoretically given by the following equation:

$$B_z(x,y,z,t)=B_0+G_x(t)\cdot x+G_y(t)\cdot y+G_z(t)\cdot z. \quad (1)$$

In practice, the magnetic field involves an additional term $B_M$ (x, y, z, t) as follows to satisfy the Maxwell equation:

$$B_z(x, y, z, t)=B_0+G_x(t)\cdot x+G_y(t)\cdot y+G_z(t)\cdot z+B_M(x, y, z, t). \quad (2)$$

The additional term $B_M$ (x, y, z, t) is referred to as the "Maxwell term" and is given by the following equation:

$$B_M(x, y, z, t)=(1/2B_0) [(G_x^2+G_y^2)z^2+G_z^2\{(x^2+y^2)/4\}-G_xG_z\,xz-G_yG_z\,yz] \quad (3)$$

wherein the main magnetic field direction is in the Z-direction.

The non-linear phase shift arises because, as can be seen from the above equation, the Maxwell term $B_M$ (x, y, z, t) contains quadratic terms of x, y and z and cross terms of xz and yz.

In low magnetic field systems, the Maxwell term has a greater weight relative to the main magnetic field $B_0$, and hence, the effect thereof increases.

Moreover, the flow compensating pulse constituted of fcrdep and fcrrep is given as short time width and as great amplitude as possible in order to reduce the echo spacing (interval between inversion pulses) in the fast spin echo technique. Since the Maxwell term involves a term proportional to the square of the amplitude of a gradient pulse, the effect exerted by the Maxwell term becomes great due to the flow compensating pulse constituted of fcrdep and fcrrep.

Thus, the image quality degradation due to the non-linear phase shift is too great to be neglected in conducting MR imaging according to the fast spin echo technique incorporating flow compensation in low magnetic field systems.

In order to cancel the phase shift due to the Maxwell term, a phase shift having the same magnitude as, and having a phase opposite to, the Maxwell term may be purposely generated and applied. However, this leads to the following difficulties:

(1) when the read gradient is employed to purposely generate the phase shift having the same magnitude as, and having a phase opposite to, the Maxwell term, it is difficult not to impart an unnecessary phase to flowing spins; and (2) because the phase shift by the quadratic terms in the Maxwell term always has a positive value, it must be inverted using an inversion pulse in order to make it have an opposite phase.

Therefore, in the MR imaging method as described regarding the first aspect, a bipolar pulse is employed in the slice gradient instead of the read gradient. This prevents the spins flowing in the read direction from being provided with an unnecessary phase. Moreover, the bipolar pulse is incorporated before an inversion pulse applied immediately before the flow compensating pulse. By this, a phase shift having a phase opposite to the phase shift due to the flow compensating pulse can be introduced by the bipolar pulse. Furthermore, the bipolar pulse is made to impart a phase shift equal to the non-linear phase shift due to the flow compensating pulse. This entire process cancels the non-linear phase shift due to the flow compensating pulse, thereby preventing image quality degradation which occurs when the flow compensating pulse is applied.

In accordance with a second aspect, the present invention provides an MR imaging apparatus comprising: pulse sequence creating means for creating a pulse sequence which incorporates a flow compensating pulse in a read gradient of a pulse sequence according to the fast spin echo technique, and incorporates a bipolar pulse in a slice gradient before an inversion pulse applied immediately before the flow compensating pulse, to impart a phase shift equal to a non-linear phase shift due to the flow compensating pulse; data acquisition means for executing the created pulse sequence to acquire data; and image producing means for reconstructing an image from the acquired data.

The MR imaging apparatus as described regarding the second aspect can suitably implement the MR imaging method in the first aspect, and MR imaging according to the fast spin echo technique incorporating flow compensation can be conducted in a low magnetic field without image quality degradation.

In accordance with the present MR imaging method and apparatus, image quality degradation by a non-linear phase shift due to a flow compensating pulse is prevented.

Further objects and advantages of the present invention will be apparent from the following description of the preferred embodiments of the invention as illustrated in the accompanying drawings.

BRIEF DESCRIPTION OF THE DRAWINGS

FIG. 6 illustrates an example of a pulse sequence for observing the effect of the correcting pulse.

DETAILED DESCRIPTION OF THE INVENTION

The present invention will now be described in more detail with reference to preferred embodiments shown in the accompanying drawings.

Figure 1:
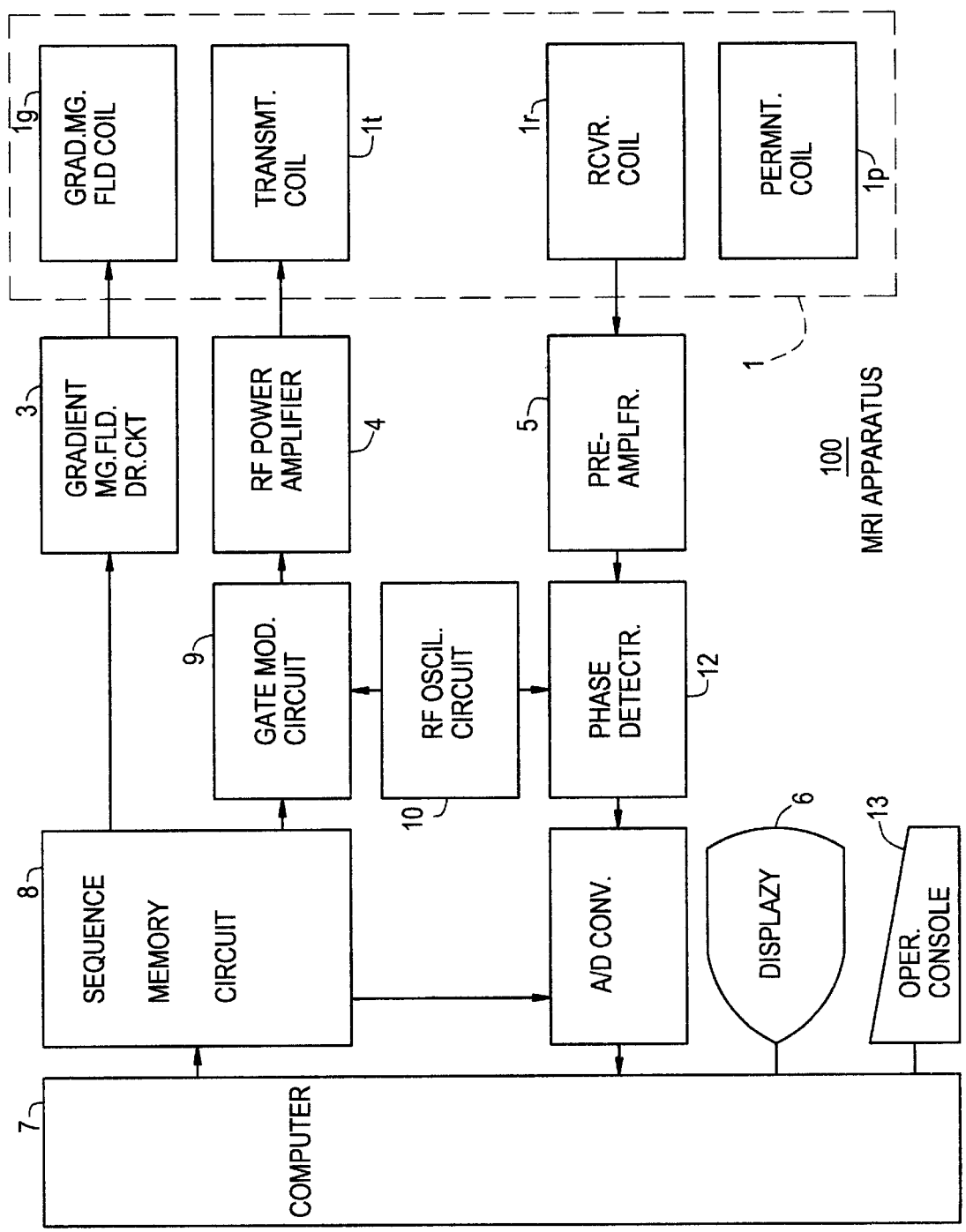
FIG. 1 is a block diagram illustrating an MR imaging apparatus in accordance with one embodiment of the present invention.

FIG. 1 is a block diagram of an MR imaging apparatus in accordance with one embodiment of the present invention.

In the MR imaging apparatus 100, a magnet assembly 1 has a space (bore) in which a subject is inserted. Surrounding the space are disposed a permanent magnet 1$p$ for applying a constant main magnetic field to the subject, a gradient magnetic field coil 1$g$ for generating gradient magnetic fields as the slice, read and encoding gradients, a transmitter coil 1$t$ for applying RF pulses for exciting or inverting spins in atomic nuclei within the subject, and a receiver coil 1$r$ for detecting an NMR signal from the subject. The gradient magnetic field coil 1$g$, the transmitter coil 1$t$ and the receiver coil 1$r$ are connected to a gradient magnetic field drive circuit 3, an RF power amplifier 4 and a preamplifier 5, respectively.

A sequence memory circuit 8 operates the gradient magnetic field drive circuit 3 based on a stored pulse sequence supplied from a computer 7 to generate the gradient magnetic fields from the gradient magnetic field coil 1$g$ in the magnet assembly 1. The sequence memory circuit 8 also operates a gate modulation circuit 9 to modulate a carrier output signal from an RF oscillation circuit 10 into a pulse-like signal having a predetermined timing and envelope shape. The pulse-like signal is supplied to the RF power amplifier 4 as an RF pulse and is power amplified in the RF power amplifier 4. The power-amplified signal is then applied to the transmitter coil 1$t$ in the magnet assembly 1 to selectively excite an imaging region.

The preamplifier 5 amplifies an NMR signal detected from the subject at the receiver coil 1$r$ in the magnet assembly 1 and supplies it to a phase detector 12. The phase detector 12 phase-detects the NMR signal supplied from the preamplifier 5 using the carrier output signal from the RF oscillation circuit 10 as a reference signal, and supplies the NMR signal to an A/D (analog-to-digital) converter 11. The A/D converter 11 converts the phase-detected analog signal into a digital signal and supplies it to the computer 7.

The computer 7 reads the data from the A/D converter 11 and performs an image reconstruction operation to produce an image of the imaging region. The image is displayed on a display device 6. The computer 7 also performs overall control, including receipt of information input from an operator console 13. The computer 7 moreover creates a pulse sequence based on commands input by the operator and supplies the pulse sequence to the sequence memory circuit 8. Therefore, the computer 7 corresponds to the pulse sequence creating means, the overall system corresponds to the pulse sequence executing means, and the computer 7 corresponds to the image producing means.

Figure 2:
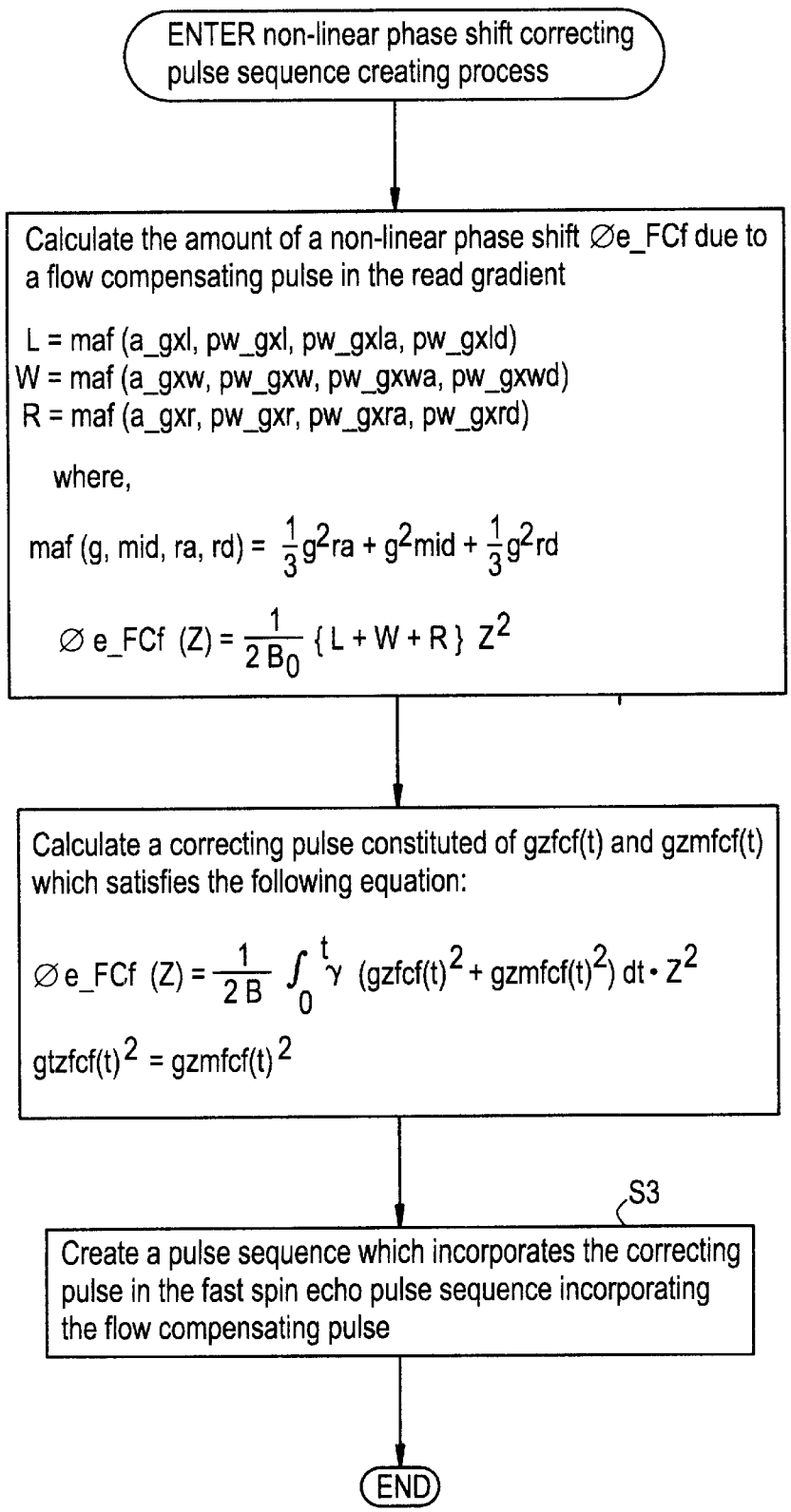
FIG. 2 is a flow chart illustrating a Maxwell-term correcting pulse sequence creating process in the MR imaging apparatus shown in FIG. 1.

FIG. 2 is a flow chart illustrating a non-linear phase shift correcting pulse sequence creating process executed in the computer 7. The process is executed subsequent to generation of a pulse sequence according to the fast spin echo technique incorporating a flow compensating pulse in the read direction.

Figure 3:
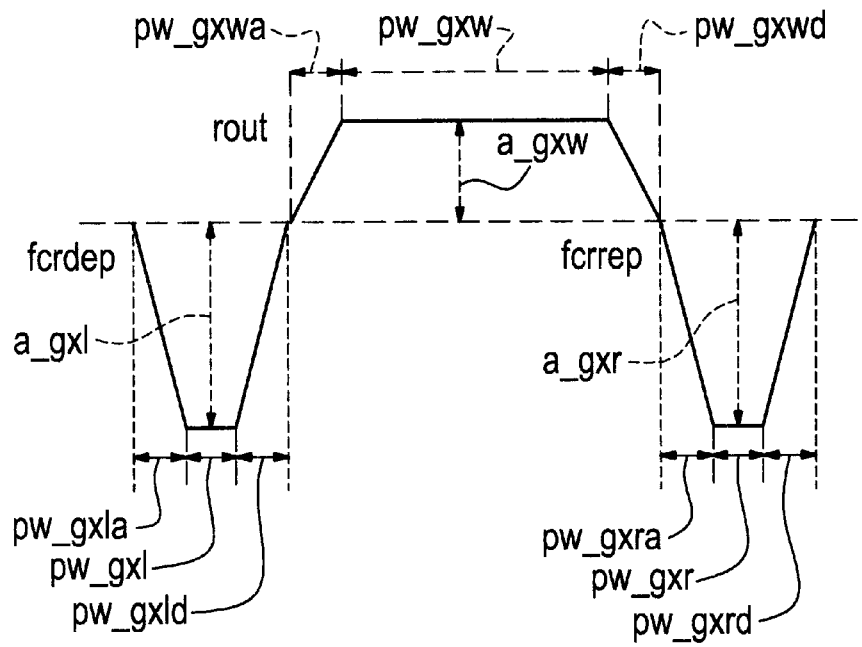
FIG. 3 illustrates the meaning of symbols indicating the time width and amplitude of a flow compensating pulse.

In Step S1, the amount of a non-linear phase shift $\phi_{\theta\_FC1}$ by the flow compensating pulse constituted of fcrdep and fcrrep is calculated according to the following equation:

$$\phi_{a\_FCf}(Z) = (\tfrac{1}{2}B+hd\ 0)\int_0^{tw}\gamma G_X(t)^2 dt \cdot z^2 = (\tfrac{1}{2}B+hd\ 0)\{maf(a\_gxl, pw\_gxl, pw\_gxla, pw\_gxld)$$
$$-maf(a\_gxw, pw\_gxw, pw\_gxwa, pw\_gxwd) -maf(a\_gxr, pw\_gxr, pw\_gxra, pw\_gxrd)\}\cdot z^2, \quad (4)$$

where, $$maf(g, mid, r_a, r_d) = (\tfrac{1}{3})\ g^2 r_a + g^2 mid + (\tfrac{1}{3}) g^2\ r_d,$$

wherein the slice gradient is in the Y-direction, the read gradient is in the X-direction and the encoding gradient is in the Z direction, and the symbols representing the pulse amplitudes and pulse widths of the read gradient are defined as shown in FIG. 3.

Figure 4:
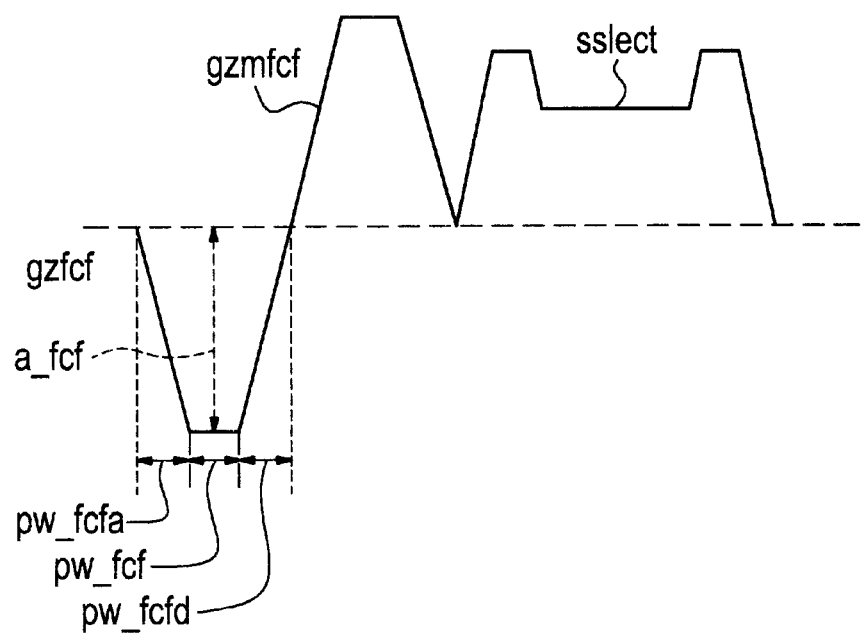
FIG. 4 illustrates the waveform of a correcting pulse.
Figure 5A:
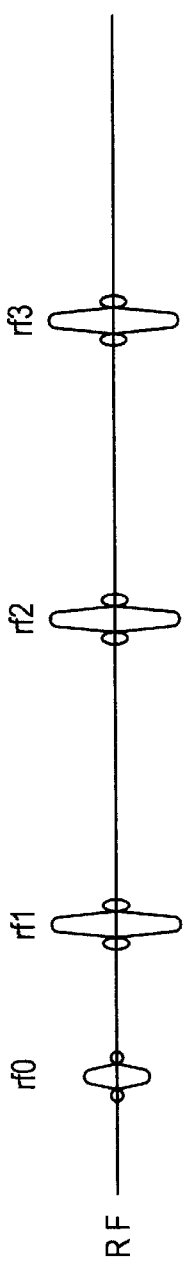
FIG. 5 illustrates an example of a pulse sequence in accordance with the present invention.
Figure 5B:
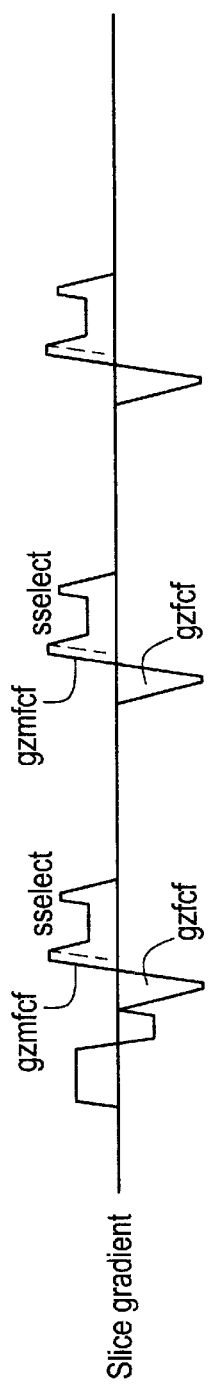
Figure 5C:
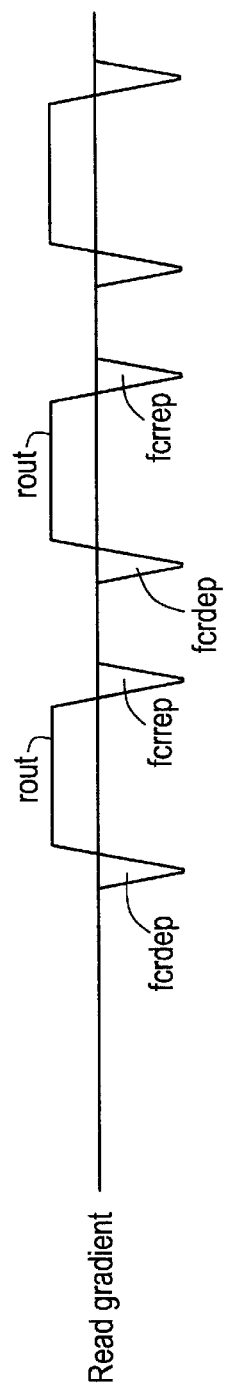
Figure 5D:
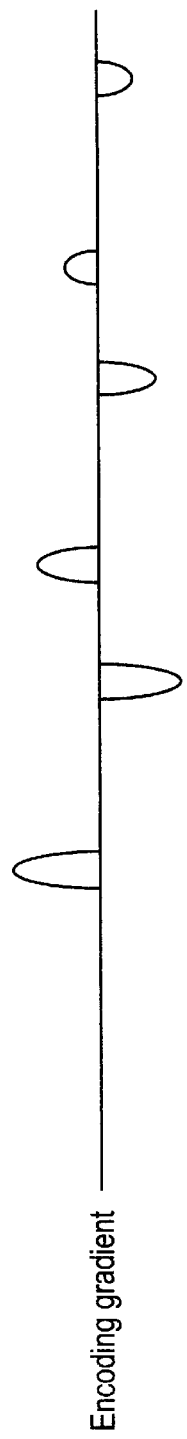

In Step S2, a correcting pulse constituted of gzfcf and gzmfcf which satisfies the equation below is calculated. In other words, the pulse amplitude and the pulse width of the correcting pulse gzfcf shown in FIG. 4 are calculated so that the equation below is satisfied. The correcting pulse gzmfcf is symmetrized with the correcting pulse gzfcf. Accordingly, the correcting pulse constituted of gzfcf and gzmfcf forms a bipolar pulse.

$$\phi_c(z) = (\tfrac{1}{2}B_0)\int_0^t (gzfcf_i(t)^2 + gzmfcf(t)^2)\cdot dt\cdot z^2 \quad (5)$$

$$\phi_{\theta\_FC1}(z) = \phi_c(z)$$

In Step S3, a pulse sequence is created which incorporates the correcting pulse constituted of gzfcf and gzmfcf in the above-mentioned pulse sequence according to the fast spin echo technique incorporating the flow compensating pulse constituted of fcrdep and fcrrep in the read gradient. The process is then terminated.

FIG. 5 exemplarily shows the created pulse sequence.

It should be noted that the pulse sequence shown incorporates the correcting pulse gzmfcf as an integral part of the fore portion of the slice selective pulse sselect.

According to the MR imaging apparatus 100, the non-linear phase shift by the correcting pulse constituted of gzfcf and gzmfcf is inverted by each of the following 180° pulses rf21, rf22, rf23, . . . , and is added in opposite phase to the non-linear phase shift due to the flow compensating pulse constituted of fcrdep and fcrrep, thereby canceling the non-linear phase shift and improving image quality.

FIG. 6 shows a pulse sequence for observing the effect of the correcting pulse constituted of gzfcf and gzmfcf.

The observation by using the pulse sequence indicates that the quadratic term of z did riot appear in the phase change when the correcting pulse constituted of gzfcf and gzmfcf was incorporated. On the other hand, the quadratic term of z as shown in Eq. (4) appeared in the phase change when the correcting pulse constituted of gzfcf and gzmfcf was not incorporated.

Many widely different embodiments of the invention may be configured without departing from the spirit and the scope of the present invention. It should be understood that the present invention is not limited to the specific embodiments described in the specification, except as defined in the appended claims.

What is claimed is:

1. An MR imaging method wherein: a flow compensating pulse is incorporated in a read gradient of a pulse sequence according to the fast spin echo technique; and a bipolar pulse is incorporated in a slice gradient before an inversion pulse applied immediately before the flow compensating pulse, to impart a phase shift equal to a non-linear phase shift due to the flow compensating pulse.

2. An MR imaging apparatus comprising:

pulse sequence creating means for creating a pulse sequence which incorporates a flow compensating pulse in a read gradient of a pulse sequence according to the fast spin echo technique, and incorporates a bipolar pulse in a slice gradient before an inversion pulse applied immediately before the flow compensating pulse, to impart a phase shift equal to a non-linear phase shift due to the flow compensating pulse;

data acquisition means for executing the created pulse sequence to acquire data; and image producing means for reconstructing an image from the acquired data.

* * * * *